(12) United States Patent
Suto

(10) Patent No.: US 9,306,090 B2
(45) Date of Patent: Apr. 5, 2016

(54) COMPOSITE PARTICLE, COMPOSITE PARTICLE DISPERSION, AND PHOTOVOLTAIC DEVICE,

(75) Inventor: Hiroyuki Suto, Numazu (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 14/413,534

(22) PCT Filed: Jul. 23, 2012

(86) PCT No.: PCT/JP2012/068630
§ 371 (c)(1),
(2), (4) Date: Jan. 29, 2015

(87) PCT Pub. No.: WO2014/016893
PCT Pub. Date: Jan. 30, 2014

(65) Prior Publication Data
US 2015/0136229 A1 May 21, 2015

(51) Int. Cl.
*H01L 31/055* (2014.01)
*H01L 31/0232* (2014.01)
*H01L 31/0352* (2006.01)
*H01L 31/0328* (2006.01)

(52) U.S. Cl.
CPC .... *H01L 31/02322* (2013.01); *H01L 31/02327* (2013.01); *H01L 31/0328* (2013.01); *H01L 31/035218* (2013.01); *H01L 31/055* (2013.01); *Y02E 10/52* (2013.01)

(58) Field of Classification Search
CPC ............... H01L 31/02322; H01L 31/02327; H01L 31/035218; H01L 31/0328; H01L 31/055
USPC .......................................................... 136/257
See application file for complete search history.

(56) References Cited

U.S. PATENT DOCUMENTS

2014/0076404 A1 * 3/2014 Tan ....................... H01L 31/055
136/263

OTHER PUBLICATIONS

A.C. Pan et al., "Enhancement of up-conversion efficiency by combining rare earth-doped phosphors with PbS quantum dots", Solar Energy Materials & Solar Cells, 2010, pp. 1923-1926, vol. 94.
L. Sudheendra et al., "Forester resonance enery transfer measurement from a gold coated upconverting nanophosphor", Proc. of SPIE, 2010, pp. 75760Y-1-75760Y-5, vol. 7576.
Feng Wang et al., "Tuning upconversion through energy migration in core-shell nanoparticles", Nature Materials, Dec. 2011, pp. 968-973, vol. 10.
"Near-IR Photoresponse in New Up-Converting CdSe/NaYF4:Yb,Er Nanoheterostructures" Chenglin Yan et al., J. Am. Chem. Soc., vol. 132, p. 8868-8869 (Jun. 10, 2010).

(Continued)

*Primary Examiner* — Jayne Mershon
(74) *Attorney, Agent, or Firm* — Sughrue Mion, PLLC

(57) ABSTRACT

A composite particle including a core member including a rare earth ion which shows an upconversion effect and a retaining material which retains the rare earth ion, and a semiconductor member covering a part or all of the surface of the core member, wherein the retaining material includes a semiconductor material having a band gap greater than energy difference necessary for a second step excitation in the rare earth ion to occur, or an insulating material, and the semiconductor member includes a semiconductor material having a band gap smaller than the energy difference between a first excited state and a ground state of the rare earth ion.

11 Claims, 8 Drawing Sheets

(56) References Cited

OTHER PUBLICATIONS

"Surface Modification of ZrO2:Er3+Nanoparticles to Attenuate Aggregation and Enhance Upconversion Fluorescence" Qiang Lu et al., J. Phys. Chem. C., vol. 112, p. 2836-2844 (Feb. 1, 2008).
"The Active-Core/ Active-Shell Approach: A Strategy to Enhance the Upconversion Luminescence in Lanthanide-Doped Nanoparticles" Fiorenzo Vetrone et al., Adv. Funct. Mater., vol. 19, p. 2924-2929 (Jul. 16, 2009).
"Plasmon-Enhanced Upconversion in Single NaYF4:Yb3+/Er3+ Codoped Nanocrystals" Stefan Schietinger et al., Nano Lett., vol. 10, p. 134-138 (Dec. 18, 2009).
Haase et al., "Upconverting Nanoparticles", Angewandte Chemie International Edition, 2011, vol. 50, pp. 5808-5829.

* cited by examiner

COMPOSITE PARTICLE, COMPOSITE PARTICLE DISPERSION, AND PHOTOVOLTAIC DEVICE,

CROSS REFERENCE TO RELATED APPLICATIONS

This application is a National Stage of International Application No. PCT/JP2012/068630filed Jul. 23, 2012, the contents of all of which are incorporated herein by reference in their entirety.

BACKGROUND OF THE INVENTION

1. Field of the Invention

The present invention relates to a composite particle which converts a low-energy light to a high-energy light, a composite particle dispersion prepared with the composite particle, and a photovoltaic device prepared with the composite particle dispersion.

2. Description of the Related Art

A solar cell has advantages that the amount of carbon dioxide emitted per power generation amount is small and it is not necessary to use fuel for power generation. Therefore, the solar cell has been hoped as an energy source to inhibit global warming. Currently, among solar cells in practical use, a mono-junction solar cell having a pair of p-n junction and using a single-crystal silicon or a polycrystal silicon has become a mainstream. In order to improve performance of the solar cells, research and development of various types of solar cells have been conducted.

An upconversion-type solar cell (hereinafter sometimes referred to as "UC type solar cell") is one of the solar cells in which the performance can be improved. The upconversion-type solar cell includes a wavelength conversion member which converts long wavelength light having a low energy and resulting in light transmission loss, to short wavelength light having an energy which can be used with a solar cell material (upconversion). The wavelength conversion member includes a wavelength conversion substance which converts the long wavelength light to the short wavelength light. As the wavelength conversion substance, a fluorescent material including a rare earth ion (hereinafter the fluorescent materials are sometimes referred to as "rare earth phosphor") and the like is known.

The upconversion easily occurs in the rare earth phosphor. However, since the band of light which can be absorbed by the rare earth phosphor is narrow, most parts of the band of the solar light cannot be used for the rare earth phosphor. In order to compensate this defect, it can be considered to use a semiconductor quantum dot (hereinafter simply referred to as "quantum dot") together with the rare earth phosphor. The quantum dot can absorb light having a wide band of solar light spectrum, whereby it is possible to convert the light to light which can be absorbed by the rare earth phosphor with a relatively high efficiency.

As a technique related to such a solar cell, for example Non-Patent Document 1 discloses a technique of using a layer including a rare earth ion and PbS quantum dot, as a layer upconverting long wavelength light.

CITATION LIST

Non-Patent Literatures

Non-Patent Document 1: Solar Energy Materials and Solar Cells, 2010, Vol. 94, pp. 1923-1926

SUMMARY OF THE INVENTION

Problems to be Solved by the Invention

In a case where the technique disclosed in Non-Patent Document 1 is employed for the UC type solar cell, the following mode can be assumed: the long wavelength light which has passed through the light absorbing layer is absorbed by the PbS quantum dot, whereby the PbS quantum dot emits light which can be absorbed by the rare earth ion; then, the rare earth ion absorbs the light twice or more; therefore the light absorbing layer absorbs the short wavelength light generated from the rare earth ion to improve power generation efficiency. However, since the light-absorbing probability of the rare earth ion is low, each rare earth ion can absorb photon around only once in several seconds. In order for the rare earth ion to have the upconversion, it is needed, while electrons are in a state of transition from the ground state by absorbing energy, to absorb the following energy to transit the electrons to a higher energy state. Here, it is considered that the time period for which the electrons transited to the excited state in the rare earth ion can exist is approximately for 20 ms at most. Considering this, with the technique disclosed in Non-Patent Document 1, it is considered that most of the electrons transited to the excited state by absorbing energy lose energy before absorbing the following energy, and as a result, the upconversion hardly occurs. As described above, it is difficult to improve the efficiency of generating the upconversion (hereinafter the efficiency is simply referred to as "upconversion efficiency") and improve the power generation efficiency of the UC type solar cell, only by simply containing the quantum dot and the rare earth ion to a same layer.

Accordingly, an object of the present invention is to provide a composite particle which can improve the upconversion efficiency, a composite particle dispersion prepared with the composite particle, and a photovoltaic device prepared with the composite particle dispersion.

Means for Solving the Problems

In order to improve the upconversion efficiency of the rare earth ion, it is needed, while the electrons that are transited to a first excited state with the energy absorbed by the rare earth ion exist, to transit the electrons existing at a first excited state to a second excited state having a higher energy, with the energy further absorbed by the rare earth ion. As a result of an intensive study, the inventor of the present invention has found out that: it is effective to arrange a quantum dot having a higher light-absorbing probability than that of the rare earth ion to the circumference of the rare earth ion close by, to thereby transfer the energy of the excited electrons excited by light absorption in the quantum dot to the rare earth ion, by dipole-dipole interaction. Further, the inventor has found out that the upconversion efficiency of the rare earth ion can become easy to be improved by limiting the number of rare earth ions to absorb light energy, compared to the number or volume of quantum dots to emit light energy, to thereby increase the frequency of the absorption of light energy. The present invention has been made based on the above findings.

In order to solve the above problems, the present invention takes the following means. Namely, a first aspect of the present invention is a composite particle including: a core member including: a rare earth ion which shows an upconversion effect; and a retaining material which retains the rare earth ion; and a semiconductor member covering a part or all of the surface of the core member, wherein the retaining material includes a semiconductor material having a band gap greater than energy difference necessary for a second step excitation in the rare earth ion to occur, or an insulating material; and the semiconductor member includes a semiconductor material having a band gap smaller than energy difference between a first excited state and a ground state of the rare earth ion.

Here, in the first aspect and other aspects of the present invention that are described below (hereinafter these aspects are sometimes collectively and simply referred to as "the present invention"), the expression "rare earth ion which shows an upconversion effect" means a rare earth ion which can absorb energy more than once to emit a higher energy light than the energy absorbed each time. More specifically, for example, the expression means a rare earth ion which can: make the electrons in the ground state (4f orbital. The same is applied hereinafter) transit to the first excited state by absorbing energy; thereafter make the electrons at the first excited state transit to the second excited state having higher energy by absorbing energy; thereafter emit one photon having the same energy as the energy difference between the second excited state and the ground state, when the electrons transited to the second excited state directly return to the ground state. Other than this, the "rare earth ion which shows an upconversion effect" of the present invention can include a rare earth ion which can emit one photon of the energy which is lost from the electron excited for three times or more, when the electron loses the energy. Also, in the present invention, the expression "a second step excitation in the rare earth ion to occur" means, by making the electrons transited to the first excited state of the rare earth ion absorb the energy, to perform transition of the electrons in the first excited state to the second excited state having higher energy. Also, in the present invention, the expression "energy difference necessary for a second step excitation in the rare earth ion to occur" means the energy difference between the second excited state and the ground state.

By having a configuration in which the surface of the core member including the rare earth which shows the upconversion effect (hereinafter the rare earth ion is sometimes referred to as "activator") is covered by the semiconductor member emitting the energy which can be absorbed by the activator, it is possible to allow the rare earth ion which shows the upconversion effect and the semiconductor material to exist close to each other. Whereby, energy transfer from the semiconductor member to the rare earth ion is promoted. Also, by having a configuration in which the semiconductor member covers the surface of the core member, it is easy to limit the amount of the rare earth ion which shows the upconversion effect by mole to a certain amount or less. This configuration makes it easy to concentrate the energy from the semiconductor member to the specific rare earth ion which shows the upconversion effect, while the electrons exist in the first excited state of the rare earth ion which shows the upconversion effect, whereby it is possible to improve the upconversion efficiency.

Also, in the first aspect of the present invention, a part or all of the surface of the semiconductor member can be covered by a semiconductor material having a band gap greater than the band gap of the semiconductor material included in the semiconductor member, or by an insulating material. This configuration inhibits the energy of the electron excited in the semiconductor member by absorbing light from being lost on the surface of the semiconductor member. As a result, the energy is transferred from the semiconductor member to the rare earth ion which shows the upconversion effect with a high efficiency, whereby it becomes easy to improve the upconversion efficiency.

Also, in the first aspect of the present invention, it is preferable that $X/Y \leq 1/100$ wherein X is amount of the rare earth ion included in the core member by mole, and Y is amount of the semiconductor material included in the semiconductor member by mole. This configuration makes it easy to concentrate the energy to transfer from the semiconductor member to each activator, whereby the frequency for each activator to absorb energy is increased. As a result, the electrons in excited state also can absorb, before losing the energy, the next energy, whereby the upconversion becomes easy to occur. By making it easy for the rare earth ion which shows the upconversion effect to absorb the energy, it becomes easy to improve the upconversion efficiency.

Also, in the first aspect of the present invention, the core member can include Er ion as the rare earth ion. This configuration also makes it possible to improve the upconversion efficiency.

Also, in the first aspect of the present invention in which the core member includes Er ion, the core member and/or the semiconductor member preferably includes Yb ion. By using Er ion and Yb ion in combination, it becomes easy to transfer the energy from the semiconductor member to Er ion via Yb ion. Therefore, this configuration makes it easy to improve the upconversion efficiency.

A second aspect of the present invention is a composite particle dispersion including a supporting material, and the composite particle according to the first aspect of the present invention, wherein the surface of the composite particle is modified by a ligand, and the composite particle is dispersed in the supporting material and is supported by the supporting material.

Here, the term "supporting material" means a substance which can disperse a plurality of composite particles thereinside and can transmit light. In the second aspect and the other aspects of the present invention described below, as the supporting material, for example a transparent resin, a transparent liquid and the like can be used. By dispersing the plurality of composite particles according to the first aspect of the present invention inside the supporting material, it is possible to obtain the composite particle dispersion including the plurality of composite particles. Since the composite particles according to the first aspect of the present invention can improve the upconversion efficiency, it is possible to obtain the composite particle dispersion which can improve the upconversion efficiency, by having this configuration.

Also, in the second aspect of the present invention, the composite particle dispersion can further include a quantum dot dispersed in the supporting material, wherein the quantum dot does not include a rare earth ion which shows the upconversion effect. By arranging the quantum dot which does not include a rare earth ion which shows the upconversion effect to the circumference of the composite particle, it becomes possible to transfer the energy absorbed by the surrounding quantum dot to the composite particle. Therefore, this configuration makes it easy to improve the upconversion efficiency.

Also, in the second aspect of the present invention, the composite particle dispersion can further include a metal fine particle in the supporting material. Here, the term "metal fine particle" means a particle made of metal and having a diameter of around no less than several nm and no more than several tens nm. The intensity of light increases at the circumference of the metal fine particle because of the effect of surface plasmon resonance. Therefore, by arranging the metal fine particles to the circumference of the composite particle close to the composite particle, it becomes easy for the semiconductor member of the composite particle to absorb the light energy, whereby it becomes easy to improve the upconversion efficiency.

Also, in the second aspect of the present invention, the composite particle dispersion can include a metal member in contact with the surface of the supporting material. By making the surface of the supporting material have contact with the metal, it becomes possible to improve the upconversion efficiency of the composite particle existing close to the metal. Therefore, this configuration makes it easy to improve the upconversion efficiency of the composite particle dispersion.

A third aspect of the present invention is a photovoltaic device including: a photoelectric conversion member which converts light energy to electricity; a wavelength conversion member including the composite particle dispersion according to the second aspect of the present invention; and a light reflecting member, wherein the photoelectric conversion member, the wavelength conversion member, and the light reflecting member are arranged in the order mentioned from the upstream side of a light propagation direction.

Here, in the third aspect and other aspects of the present invention described below, the term "photovoltaic device" means a device which takes out the electricity generated by absorbing light. For example the photovoltaic device includes a solar cell and the like. Since the composite particle dispersion according to the second aspect of the present invention can improve the upconversion efficiency, by employing the composite particle dispersion to the photovoltaic device, it becomes possible to obtain the UC type solar cell in which power generation efficiency is improved.

A fourth aspect of the present invention is a photovoltaic device including: a photoelectric conversion member which converts light energy to electricity; and a wavelength conversion member including the composite particle dispersion according to the second aspect of the present invention, wherein the photoelectric conversion member and the wavelength conversion member are arranged in the order mentioned from the upstream side of a light propagation direction; and the supporting material is arranged between the metal member and the photoelectric conversion member.

The fourth aspect of the present invention corresponds to a configuration in which the metal member is used for the light reflecting member according to the third aspect of the present invention. By using the metal member for the light reflecting member, it becomes easy to improve the upconversion efficiency of the composite particle existing close to the metal, by the effect of surface plasmon resonance. Therefore, this configuration makes it possible to obtain the UC type solar cell in which the power generation efficiency is improved.

Effects of the Invention

According to the present invention, it is possible to provide a composite particle which can improve the upconversion efficiency, a composite particle dispersion prepared with the composite particle, and a photovoltaic device prepared with the composite particle dispersion.

DETAILED DESCRIPTION OF THE INVENTION

Figure 1:
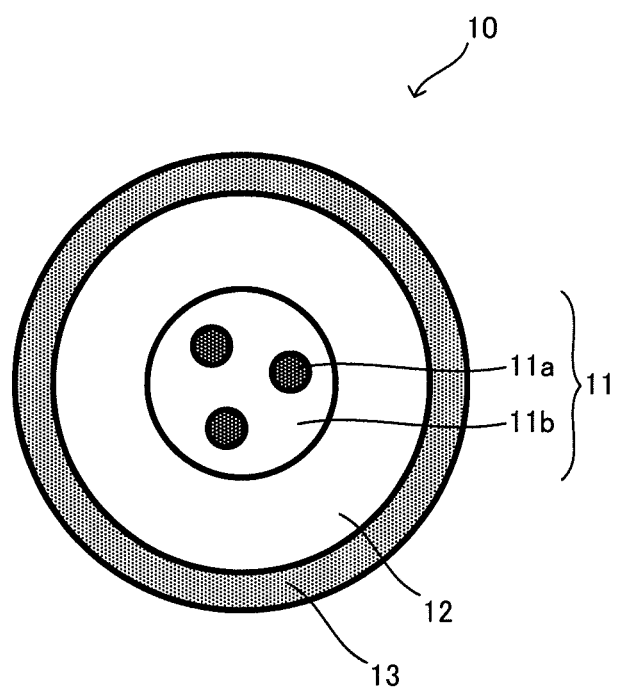
FIG. 1 is a view to explain a composite particle 10.

Since the light-absorbing probability of the rare earth ion is low, the energy in a state of light is difficult to be absorbed by the activator. In contrast, by adding energy by means of dipole-dipole interaction, it becomes possible to increase the probability of the activator to absorb the energy. Here, in a case where the distance between the quantum dot and the activator is no more than 10 nm, it becomes easy for energy to transfer from the quantum dot to the activator by the dipole-dipole interaction. This dipole-dipole interaction is occurred in inverse proportion to the sixth power of the distance. Therefore, if the quantum dot and the activator become closer to each other, the energy transfer probability is rapidly increased. Therefore, in order to improve the upconversion efficiency in the activator, it is effective to arrange the quantum dot and the activator such that the distance between them is no more than 10 nm.

In this system in which the activator and the quantum dot are positioned close to each other, defining the lifetime of the electron excited in the activator as $\tau_{Ln}$, the number of the activator existing close to one quantum dot as $N_{Ln}$, and the average time interval of the quantum dot to absorb light as $\Delta t_{QD}$, the condition in which the upconverison occurs in the activator is represented by the following Formula (1).

$$\tau_{Ln}/N_{Ln} >> \Delta t_{QD} \tag{1}$$

It should be noted that the value obtained by dividing $\Delta t_{QD}$ by the quantum yield $\Phi_{UC}$ obtained by dividing the number of photons generated by the upconversion in the quantum dot by the number of photons entered in the quantum dot is nearly the average time interval of the quantum dot to emit the energy.

Also, defining the volume of the quantum dot as $V_{QD}$, the flow of photon from solar light per unit dimension and per unit time as $N_{photon}$, the light absorption coefficient of the quantum dot as $\alpha_{QD}$, and the quantum yield of photo luminescence light emitting of the quantum dot as $\Phi_{PL}$, the following Formula (2)

$$\Delta t_{QD} \approx 1/(V_{QD} \cdot N_{photon} \cdot \alpha_{QD} \cdot \Phi_{PL}) \tag{2}$$

is satisfied. Therefore, the following Formula (3) is obtained from the above Formulas (1) and (2).

$$\Delta \tau_{Ln} >> N_{Ln}/(V_{QD} \cdot N_{photon} \cdot \alpha_{QD} \cdot \Phi_{PL}) \tag{3}$$

From the above Formula (3), it can be said that having a large light absorption coefficient of the quantum dot and having a large volume (number of mole) of the quantum dot are advantageous for improving the upconversion efficiency in the activator, whereby it can be said that the number of the activator needs to be controlled/inhibited so as not to be increased too much.

In most rare earth phosphors, the upconversion intensity $I_{UC}$ defined by the proportion of the intensity of excitation light to the intensity of incident light is directly proportional to a power (n power: n>2) of the intensity of incident light, in a case where the intensity $I_{in}$ of incident light is weak. In a case where the energy absorbed by the quantum dot is forcibly added to the activator by means of the dipole-dipole interaction, the energy absorbed by the quantum dot according to the intensity $I_{in}$ of incident light transfers to each activator existing to circumference of the quantum dot, so that the energy is distributed to each activator. The transfer of the energy to each activator is considered to occur in inverse proportion to the number of the activator. Therefore, the following Formula (4) is satisfied.

$$I_{UC} \propto N_{Ln} \times (I_{in})^n \propto N_{Ln} \times (1/N_{Ln})^n = N_{Ln}^{(1-n)} \quad (4)$$

From the above Formula (4), since n>2, it is considered that it is possible to increase the upconversion intensity $I_{UC}$, by reducing the number of the activator comparing to the number of the quantum dot (or by reducing the number of the activator existing close to one quantum dot).

If it is hoped to obtain the UC type solar cell in which the power generation efficiency is improved, by allowing the absorbing layer to absorb the light (excitation light) generated by the upconversion, not only increasing the frequency of the upconversion (upconversion efficiency) but also increasing the intensity of the excitation light is important. This can be attained by collecting the solar light.

The inventor of the present invention has been made the present invention based on the above ideas. Hereinafter, the embodiments of the present invention are explained with reference to the drawings. Some of repeated reference numerals in the following drawings are omitted. It should be noted that the embodiments shown below is examples of the present invention and the present invention is not limited to the embodiments.

1. Composite Particles

FIG. 1 is a view to explain the composite particle 10 of the present invention. The composite particle 10 shown in FIG. 1 includes a core member 11, a semiconductor member 12 which covers the surface of the core member 11, and a shell member 13 which covers the surface of the semiconductor member 12. The core member 11, the semiconductor member 12, and the shell member 13 are arranged concentrically.

The core member 11 includes a rare earth ion (activator 11*a*, 11*a*, . . . ) which shows the upconversion effect and a retaining material which retains the activator 11*a*, 11*a*, . . . in a state of being dispersed. The retaining material 11*b* is a semiconductor material and its band gap Eg11 is wider than the energy difference between the second excited state and the ground state of the activator 11*a*, 11*a*, . . . . In the composite particle 10, the diameter of the core member 11 is approximately no more than 5 nm.

The semiconductor member 12 is a portion corresponding to the conventional quantum dot and includes a semiconductor material. The semiconductor material of the semiconductor member 12 has a band gap of Eg12 which is narrower than the energy difference between the first excited state and the ground state of the activator 11*a*, 11*a*, . . . . Discrete quantum levels are formed on the conductive band side and the valence band side of the semiconductor material. The semiconductor member 12 can absorb light having energy same as or greater than the band gap Eg12. The thickness and material of the semiconductor member 12 are adjusted such that the energy difference Egq12 between the quantum level positioned closest to the conduction band among the quantum levels formed on the conduction band side and the quantum level positioned on a side closest to the valence band among the quantum levels formed on the valence band side becomes an energy which can be absorbed by the activator 11*a*, 11*a*, . . . . In the composite particle 10, the thickness of the semiconductor member 12 is less than 10 nm. Hereinafter, the quantum level positioned closest to the conduction band among the quantum levels formed on the conduction band side is sometimes referred to as "the first quantum level on the conduction band" and the quantum level positioned closest to the valence band among the quantum levels formed on the valence band side is sometimes referred to as "the first quantum level on the valence band side".

The shell member 13 includes a semiconductor material. The band gap Eg13 of the semiconductor material is wider than Egq12. In the composite particle 10, the thickness of the shell member 13 is no more than several nm.

Figure 2:
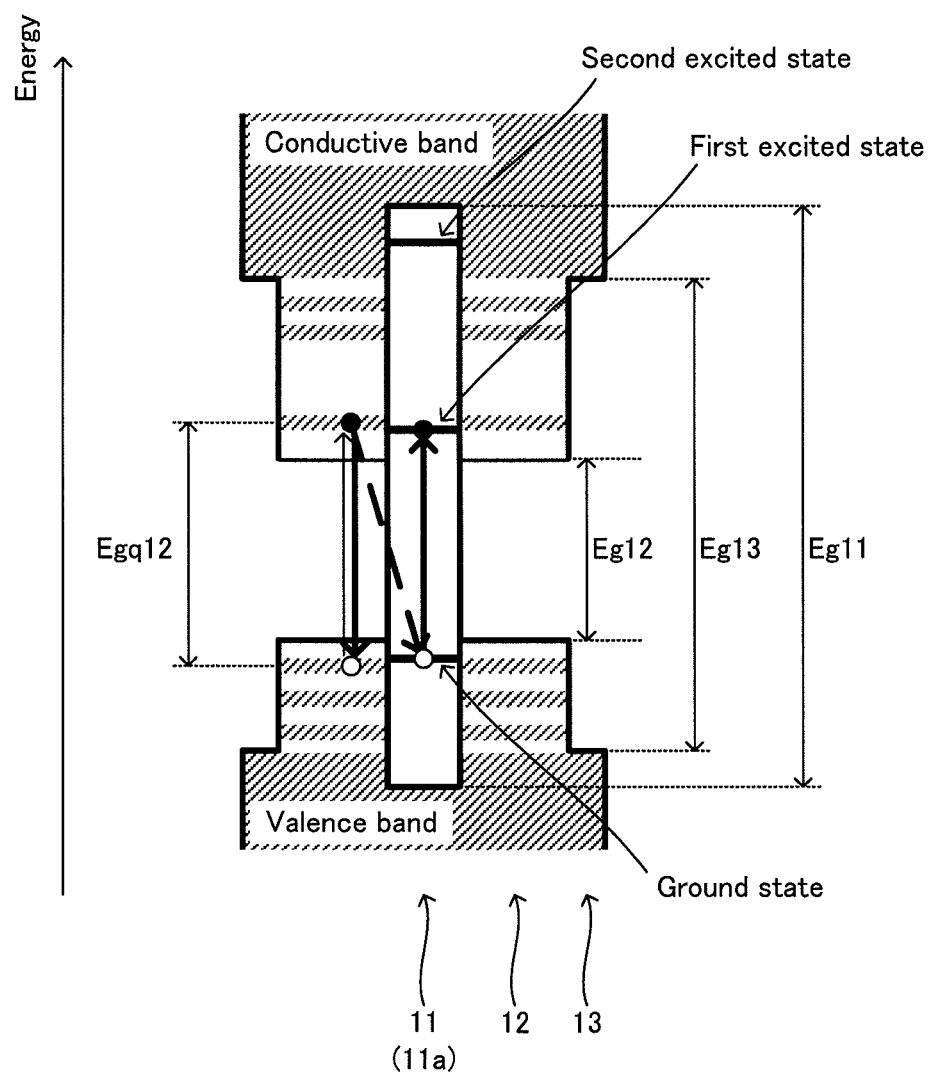
FIG. 2 is a view to explain a transfer form of the energy in the composite particle 10.

FIG. 2 is a view to explain the transfer form of the energy in the composite particle 10. In FIG. 2, to the same structure as those in the composite particle 10 shown in FIG. 1, the same reference numerals as those used in FIG. 1 are given and the explanation thereof is arbitrarily omitted. In FIG. 2, the closed circle indicates an electron and the opened circle indicates a hole. The linear dashed arrow indicates the energy transfer from the semiconductor member 12 to the activator 11*a*.

When light reaches the composite particle 10, light which was not absorbed by the shell member 13 since the energy is less than Eg13 reaches the semiconductor member 12. The semiconductor member 12 can absorb light having energy of no less than Egq12. For example, when the semiconductor member 12 absorbs light having energy of Egq12, electrons are excited from the valence band of the semiconductor material included in the semiconductor member 12, then the electrons starts to exist in the first quantum level on the conduction band side, whereby holes start to exist in the first quantum level on the valence band side.

In the composite particle 10, the core member 11 exists inside the semiconductor member 12, and the core member 11 includes the activator 11*a*, 11*a*, . . . . The thickness of the semiconductor member 12 is less than 10 nm, and the diameter of the core member 11 is approximately no more than 5 nm. Therefore, the distance between the portion where the electrons excited because of light absorption in the semiconductor member 12 and the activator 11*a* can be set as less than 10 nm. By allowing the semiconductor material of the semiconductor member 12 and the activator 11*a* to have the distance as described above, the energy of the semiconductor material of the semiconductor member 12 can transfer to the activator 11*a* by means of the dipole-dipole interaction. As described above, Egq12 is adjusted to be the energy which can be absorbed by the activator 11*a*. Therefore, the energy absorbed by the semiconductor member 12 can be absorbed by the activator 11*a* by transferring by means of the dipole-dipole interaction. When the activator 11*a* absorbs the energy as above, the electrons transit from the ground state to the first excited state of the activator 11*a*. On the other hand, in the semiconductor material of the semiconductor member 12 which has given energy to the activator 11*a*, the electrons which used to exist in the first quantum level on the conduction band side lose its energy.

In the composite particle 10, the energy absorbed by the semiconductor member 12 transfers to the activator 11*a*, 11*a*, . . . with the above embodiment. In the composite particle 10, since the activator 11*a*, 11*a*, . . . exists close to the semiconductor material of the semiconductor member 12, the energy can easily transfer from the semiconductor member 12 to the activator 11*a*, 11*a*, . . . . Therefore, the activator 11*a*, 11a, . . . easily absorb the next energy while the electrons transited from the ground state to the first excited state exist. When the activator 11a, 11a, . . . having the electron transited to the first exited state absorbs the energy, it is possible to transit the electrons existing in the first exited state to the second excited state having higher energy. The electrons excited to the second excited state can emit light (excitation light) equivalent to the energy difference between the second excited state and the ground state, when directly returning to the ground state. In the composite particle 10, the upconversion occurs in the activator 11a, 11a, . . . with the above process.

The core member 11 including the activator 11a, 11a, . . . and the semiconductor member 12 including the semiconductor material are in contact with each other in the composite particle 10. Therefore, it is possible to arrange the semiconductor material of the semiconductor member 12 and the activator 11a, 11a, . . . close to each other. Further, by adjusting the diameter of the core member 11 and the thickness of the semiconductor member 12, it is possible to arrange the semiconductor material of the semiconductor member 12 and the activator 11a, 11a, . . . having a distance in which the energy can transfer by means of the dipole-dipole interaction. If the light absorbed by the quantum dot is converted to light having other energy and emitted as before, since the light-absorbing probability of the rare earth ion is low, it is difficult to improve the upconversion efficiency. In contrast, according to the composite particle 10 which transfers energy by means of the dipole-dipole interaction, since the activator 11a, 11a, . . . easily absorbs the energy, it is easy to generate the upconversion in the activator 11a, 11a, . . . .

Further, in the composite particle 10, the semiconductor member 12 is arranged so as to cover the surface of the core member 11 including the activator 11a, 11a, . . . . By having this arrangement, it becomes easy to decrease the amount of the activator 11a, 11a, . . . than the amount of the semiconductor material of the semiconductor member 12. By keeping down the amount of the activator 11a, 11a, . . . , it becomes possible to increase the frequency of transfer of the energy from the semiconductor member 12 to each of the activator 11a, 11a, . . . whereby it becomes easy for the activator 11a, 11a, . . . having the electrons transited to the first excited state to absorb the energy. As a result, it becomes possible to improve the upconversion efficiency. In contrast, if a layer including the activator covers the surface of the semiconductor material, it is needed to thinly make the layer including the activator, in order to keep down the amount of the activator. If a layer including a small amount of the activator enough to improve the upconversion efficiency is formed on the surface of the semiconductor material having a size enough to absorb a sufficient amount of energy to transfer to the activator, it is needed to extremely thinly form the layer including the activator. If the layer including the activator is extremely thinly formed on the surface of the semiconductor material, the activator close to the surface easily lose its energy, whereby it can be difficult for the upconversion to occur. Therefore, in view of having a configuration in which the upconversion efficiency is easy to be improved, it is preferable that the semiconductor member 12 is arranged so as to cover the surface of the core member 11 including the activator 11a, 11a, . . . , as in the composite particle 10.

In addition, by arranging the semiconductor member 12 so as to surround the core member 11 including the activator 11a, 11a, . . . , the semiconductor material which absorb light can surround the activator 11a, 11a, . . . . In the composite particle 10, since the semiconductor material of the semiconductor member 12 and the activator 11a, 11a, . . . are arranged close to each other, it is possible to transfer the energy from the semiconductor material existing in the circumference of the activator 11a, 11a, . . . to the activator 11a, 11a, . . . , by means of the dipole-dipole interaction. That is, in the composite particle 10, it is possible to collect the energy absorbed by the semiconductor material of the semiconductor member 12 arranged to the circumference of the activator 11a, 11a, . . . to the activator 11a, 11a, . . . arranged inside the semiconductor material. By collecting energy to the activator 11a, 11a, . . . in this way, not only it becomes possible to improve the upconversion efficiency in the activator 11a, 11a, . . . , but also it becomes possible to increase the intensity of the excitation light generated by the upconversion.

Also, in the semiconductor member 12, the electrons and holes can exist at different places. Therefore, in the composite particle 10 in which the semiconductor member 12 is arranged so as to cover the core member 11 including the activator 11a, 11a, . . . , the activator 11a, 11a, . . . can be sandwiched by the electrons and holes existing at different places in the semiconductor member 12. With this state, the activator 11a, 11a, . . . is subjected to a strong electric field, and the dipole-dipole interaction becomes stronger. Whereby, the probability of the energy transfer from the semiconductor member 12 to the activator 11a, 11a, . . . is increased. If the probability of the energy transfer from the semiconductor member 12 to the activator 11a, 11a, . . . is increased, the upconversion becomes easy to occur in the activator 11a, 11a, . . . . Therefore, according to the composite particle 10, it is possible to improve the upconversion efficiency.

In the composite particle 10, a known rare earth ion which shows the upconversion effect can be used for the activator 11a. Examples of the rare earth ion include one or more selected from the group consisting of Er, Tm, Dy, and Eu.

Also, for the retaining material 11b which retains the activator 11a, 11a, . . . in a state of being dispersed, a known semiconductor material having a wider band gap than the energy difference between the second excited state and the ground state of the activator 11a can be adequately used. Examples of the semiconductor material include oxides such as $Y_2O_3$, $YAlO_3$, YAG, fluorides such as $NaYF_4$, nitrides such as AlN, GaN, SiAlON, in a case Yb is not included, sulfides such as ZnS, ZnMgS. Additionally, insulation materials can be used for the retaining material of the core member in the composite particle of the present invention.

In the core member 11, the amount of the activator 11a to be dispersed in the retaining material 11b by mole is not particularly limited. However, in view of having a configuration in which the upconversion efficiency is easy to be improved, and in view of having a configuration in which the upconversion intensity is easy to be increased, it is preferable that the amount of the activator 11a by mole is kept small. More specifically, preferably $X/Y \leq 1/100$, wherein X is the amount of the activator 11a by mole and Y is the amount of the semiconductor material to be used for the semiconductor member 12 by mole.

The producing method of the core member 11 is not particularly limited, and the core member 11 can be produced by means of a known production method of a quantum dot. The core member 11 can be produced by using a raw material solution in which the activator 11a, 11a, . . . is dispersed in the retaining material 11b in a liquid form and by means of hot injection method, coprecipitation method, thermal decomposition method, solvothermal method, sol-gel method and the like.

In addition to the activator 11a, 11a, . . . and the retaining material 11b, the core member 11 can also include a rare earth ion which helps the energy to transfer from the semiconductor member 12 to the activator 11a, 11a, . . . (hereinafter the rare earth ion is sometimes referred to as "sensitizer"). Examples of the rare earth which can be used as the sensitizer include Yb and the like.

Also, for the semiconductor material of the semiconductor member 12, a known semiconductor material whose band gap is smaller than the energy difference between the first excited state and the ground state of the activator 11a can be adequately used. Examples of the semiconductor material include CdSe, PbS, InN, and chalcopyrite-based semiconductor material represented by $Cu_2SnS_3$ and the like.

The semiconductor member 12 can be produced in the same manner as the core member 11: that is, after producing the core member 11 by the above method, the core member 11 is separated from the liquid; next, the separated core member 11 is put in the semiconductor material (the semiconductor material to form the semiconductor member 12) in a fluidization state; thereafter, by carrying out hot injection method, coprecipitation method, thermal decomposition method, solvothermal method, sol-gel method or the like, the semiconductor member 12 can be produced on the surface of the core member 11.

The semiconductor member 12 can further include a similar sensitizer to the sensitizer which can be included in the core member 11. Even if a same sensitizer is dispersed in the core member 11 and the semiconductor member 12, for example Yb is difficult to receive an effect from the crystal field, whereby there is no large difference in energy level between the Yb in the core member 11 and Yb in the semiconductor member 12. Therefore, it becomes possible to immediately transfer the energy from the semiconductor member 12 to the activator 11a, 11a, . . . .

Also, a known semiconductor material having a wider band gap than Egq12 can be adequately used for the shell member 13. Examples of the semiconductor material include ZnO, ZnS, $Y_2O_3$, $NaYF_4$ and the like. Other than these, in the composite particle of the present invention, insulating materials can be used for the shell member.

The shell member 13 can be produced in the same manner as the core member 11 and the semiconductor member 12: that is, after producing the semiconductor member 12, the semiconductor member 12 containing the core member 11 (hereinafter the semiconductor member is simply referred to as "semiconductor member 12") is separated from the fluid; next, the separated semiconductor member 12 is put inside the semiconductor material (the semiconductor material to configure the shell member 13) in a fluidization state or an insulation material; thereafter, by carrying out hot injection method, coprecipitation method, thermal decomposition method, solvothermal method, sol-gel method or the like, the shell member 13 can be produced on the surface of the semiconductor member 12.

In the composite particle 10 produced as above, the intensity of excitation light can be confirmed during the semiconductor member 12 is produced. This makes it possible to identify the thickness of the semiconductor member 12 with which the intensity of the excitation light becomes strong. By determining the thickness of the semiconductor member 12 while confirming the intensity of the excitation light, it becomes possible to adjust the energy Egq12 of the semiconductor member 12 to the absorption energy of the activator 11a, 11a, . . . whereby it becomes easy to improve the upconversion efficiency and the upconversion intensity.

In the above explanation regarding the present invention, the composite particle 10 having a configuration in which the shell member 13 is arranged outside the semiconductor member 12 is exemplified. However, the present invention is not limited to this configuration. The composite particle of the present invention can have a configuration in which the shell member is not included, depending on the semiconductor material forming the semiconductor member 12. The composite particle of the present invention can have this configuration because the medium positioned to the circumference of the composite particle (for example, in a case where the composite particle of the present invention is dispersed in a supporting material, the medium is the supporting material) can have a role of the shell member, that is, a role of not allowing the electrons to transfer outside and a role of reducing the defect on the surface where is to be the center of non-radiative recombination of electron and hole, depending on the semiconductor material to form the semiconductor member 12.

2. Composite Particle Dispersion

Figure 3:
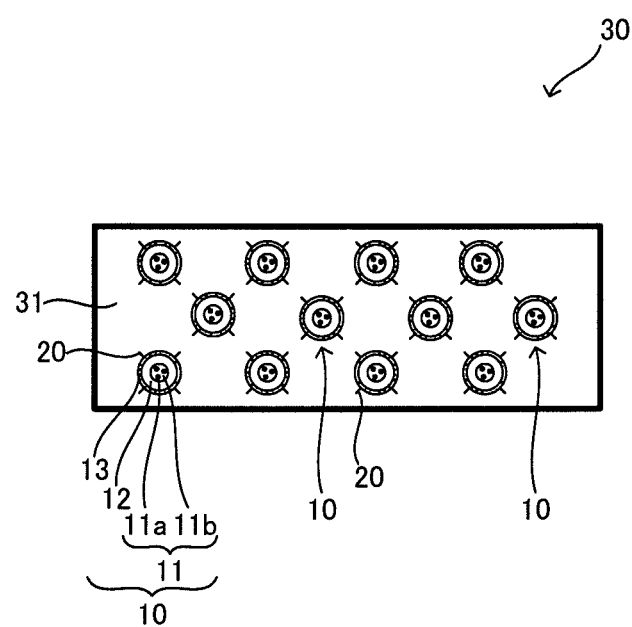
FIG. 3 is a view to explain a composite particle dispersion 30.

FIG. 3 is a view to explain the composite particle dispersion 30 of the present invention. In FIG. 3, to the same structure as those in the composite particle 10 shown in FIG. 1, the same reference numerals as those used in FIG. 1 are given and the explanation thereof is arbitrarily omitted. In FIG. 3, the composite particle 10, 10, . . . is shown being simplified.

The composite particle dispersion 30 shown in FIG. 3 includes the composite particle 10, 10, . . . and the supporting material 31 to disperse the composite particle 10, 10, . . . . . A ligand 20, 20, . . . modifies the surface of the composite particle 10. The supporting material 31 is a transparent resin, and the ligand 20 is preferably an amine-based organic substance having amino group. The composite particle 10, 10, . . . whose surface is modified by the ligand 20, 20, . . . can be dispersed inside the transparent resin in a fluidization state. That is, the composite particle dispersion 30 is produced by going through the process of: dispersing the composite particle 10, 10, . . . whose surface is modified by the ligand 20, 20, . . . in the transparent resin in a fluidization state; thereafter solidifying the obtained material.

As described above, the composite particle 10, 10, . . . can improve the upconversion efficiency better than the conventional substance prepared with rare earth phosphor and can increase the upconversion intensity. Therefore, by having a configuration shown in FIG. 3, it is possible to provide the composite particle dispersion 30 which can improve the upconversion efficiency and the upconversion intensity.

In the composite particle dispersion 30, as the amine-based organic substance having amino group used for the ligand 20 which modifies the surface of the composite particle 10, 10, . . . , dodecylamine, hexadecylamine, octylamine and the like can be exemplified. Other than these, in the composite particle dispersion of the present invention, as the ligand which modifies the surface of the composite particle to be dispersed inside the transparent resin, thiol-based organic substances such as dodecanethiol, hexadecanethiol, and benzenethiol can be used.

Also, as the supporting material 31 holding the composite particle 10, 10, . . . in a state of being dispersed in the supporting material 31, a known transparent resin which can make light reach the composite particle 10, 10, . . . can be adequately used. As the transparent resin, polystyrene, acrylic resin and the like can be exemplified.

In the above explanation regarding the composite particle dispersion 30 according to the first aspect of the present invention, a configuration in which the transparent resin is used as the supporting material 31 to disperse the composite particle 10, 10, . . . is explained. However, the composite particle dispersion of the present invention is not limited to this configuration. The supporting material to disperse the composite particle may be a solar solvent such as water or may be a non-polar solvent such as toluene and chloroform. In a case where the composite particle of the present invention is dispersed in a polar solvent such as water, as the ligand which modifies the surface of the composite particle of the present invention, for example, thioglycolic acid, ethanolamine and the like having thiol group or amine group that coordinate to the surface of the particle, and having acid group or amine group that have a high affinity for polar solvent positioned opposite from the thiol group or amine group can be used. Also, in a case where the composite particle of the preset invention is dispersed in the non-polar solvent such as toluene and chloroform, as the ligand which modifies the surface of the composite particle of the present invention, for example, dodecanethiol, hexadecanethiol, and benzenethiol and the like having thiol group, amine group, or acetic acid group that coordinate to the surface of the particle, and having hydrocarbon group having a high affinity for non-polar solvent positioned opposite from the thiol group, amine group, or acetic acid group can be used.

Figure 4:
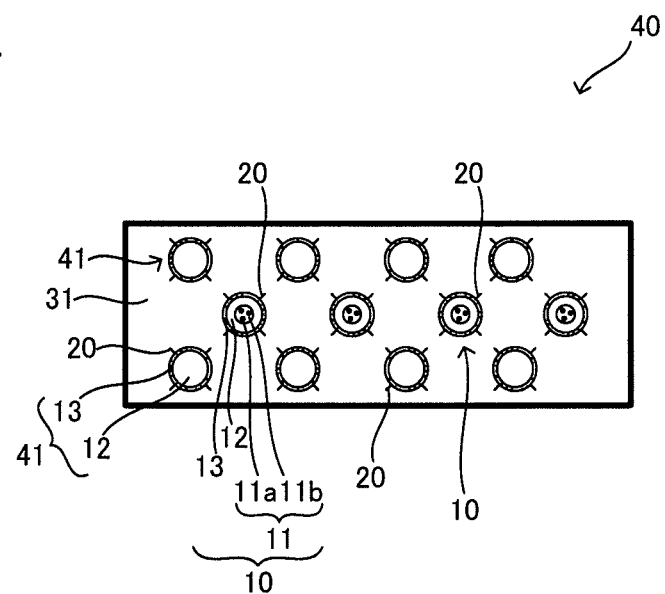
FIG. 4 is a view to explain a composite particle dispersion 40.

FIG. 4 is a view to explain the composite particle dispersion 40 of the present invention. In FIG. 4, to the same structure as those in the composite particle dispersion 30 shown in FIG. 3, the same reference numerals as those used in FIG. 3 are given and the explanation thereof is arbitrarily omitted. The composite particle dispersion 40 shown in FIG. 4 includes the composite particle 10, 10, . . . whose surface is modified by the ligand 20, 20, . . . and a quantum dot 41, 41, . . . whose surface is modified by the ligand 20, 20, . . . that are dispersed in the supporting material 31. The quantum dot 41 is configured in the same manner as in the composite particle 10 except that the core member 11 is not included in the quantum dot 41. As shown in FIG. 4, the quantum dot 41, 41, . . . is dispersed in the circumference of the composite particle 10 of the composite particle dispersion 40. By arranging the quantum dot 41, 41, . . . close (for example a distance approximately no more than 10 nm) to the composite particle 10, it becomes possible to transfer the energy absorbed by the quantum dot 41, 41, . . . to the composite particle 10, by means of the dipole-dipole interaction. Also, by arranging the quantum dot 41, 41, . . . such that the distance between the composite particle 10 and the quantum dot 41, 41, . . . is farther than 10 nm, it becomes possible to make the composite particle 10 absorb the excitation light emitted from the quantum dot 41, 41, . . . . Both configurations can concentrate the energy absorbed by the quantum dot 41, 41, . . . to the semiconductor member 12 of the composite particle 10, whereby it becomes possible to increase the energy which can be absorbed by the semiconductor member 12. By making it possible for the semiconductor member 12 to absorb much energy, it becomes possible to increase the energy intensity to transfer to the core member 11, whereby it becomes possible to increase the upconversion intensity by the activator 11a, 11a, . . . . Therefore, according to the composite particle dispersion 40 in which the quantum dot 41, 41, . . . is dispersed together with the composite particle 10, 10, . . . , it is possible to increase the upconversion intensity in the composite particle 10, 10, . . . .

If it is possible to disperse the quantum dot 41, 41, . . . in a liquid with a high concentration, a similar effect as that of the composite particle dispersion 40 can be expected even in a case where a liquid is used for the supporting material. However, the maximum concentration of the quantum dot 41, 41, . . . which can be dispersed in the liquid tends to be lower than the maximum concentration of the quantum dot 41, 41, . . . which can be dispersed in the transparent resin. Therefore, in a case where the composite particle dispersion includes the supporting material in which the quantum dot configured in the same manner as in the composite particle of the present invention except that the core member is not included is dispersed together with the composite particle of the present invention, it is possible to use the transparent resin for the supporting material.

As in the composite particle 10, 10, . . . , a sensitizer can be added to the quantum dot 41, 41, . . . . For example, by adding a sensitizer to the quantum dot 41, 41, . . . and the composite particle 10, 10, . . . , the energy becomes easy to transfer inside the quantum dot 41, between the quantum dot 41 and the composite particle 10, and inside the composite particle 10, whereby it becomes easy to increase the upconversion intensity.

Figure 5:
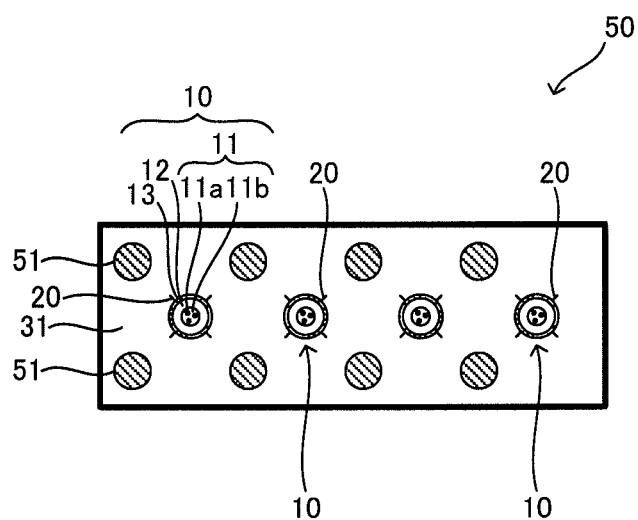
FIG. 5 is a view to explain a composite particle dispersion 50.

FIG. 5 is a view to explain the composite particle dispersion 50 of the present invention. In FIG. 5, to the same structure as those in the composite particle dispersion 40 shown in FIG. 4, the same reference numerals as those used in FIG. 4 are given and the explanation thereof is arbitrarily omitted.

The composite particle dispersion 50 shown in FIG. 5 is configured in the same manner as in the composite particle dispersion 40 except that a metal fine particle 51, 51, . . . is dispersed inside the supporting material 31, instead of the quantum dot 41, 41, . . . in the composite particle dispersion 40. That is, in the composite particle dispersion 50, the metal fine particle 51, 51, . . . is dispersed to the circumference of the composite particle 10. At the circumference (for example, an area having distance from the metal fine particle 51 of approximately no more than 100 nm) of the metal fine particle 51 configured by gold or silver and having a diameter of no less than several nm and no more than several tens nm, the light intensity is increased because of the effect of the surface plasmon resonance. Therefore, by dispersing the composite particle 10, 10, . . . and the metal fine particle 51, 51, . . . in the supporting material 31 such that the distance between the composite particle 10, 10, . . . and the metal fine particle 51, 51, . . . is no more than 100 nm, it becomes possible to increase the intensity of the light to be absorbed by the composite particle 10, 10, . . . . By increasing the intensity of the light to be absorbed by the composite particle 10, 10, . . . as described above, it becomes possible to increase the intensity of the energy to transfer to the core member 11, 11, . . . , whereby it becomes possible to increase the upconversion intensity by the activator 11a, 11a, . . . . Therefore, according to the composite particle dispersion 50 in which the metal fine particle 51, 51, . . . is dispersed together with the composite particle 10, 10, . . . , it becomes possible to increase the upconversion intensity in each of the composite particle 10, 10, . . . .

In the explanation regarding the composite particle dispersion of the present invention prepared with the metal fine particle 51, 51, . . . , a configuration in which the metal fine particle 51, 51, . . . is used instead of the quantum dot 41, 41, . . . is described. However, the composite particle dispersion of the present invention is not limited to this configuration. The composite particle dispersion of the present invention can have a configuration in which a quantum dot configured in the same manner as in the composite particle of the present invention except that it does not include the core member, and the metal fine particle are dispersed in the supporting material. This configuration also can provide a composite particle dispersion in which the upconversion intensity is increased.

Figure 6:
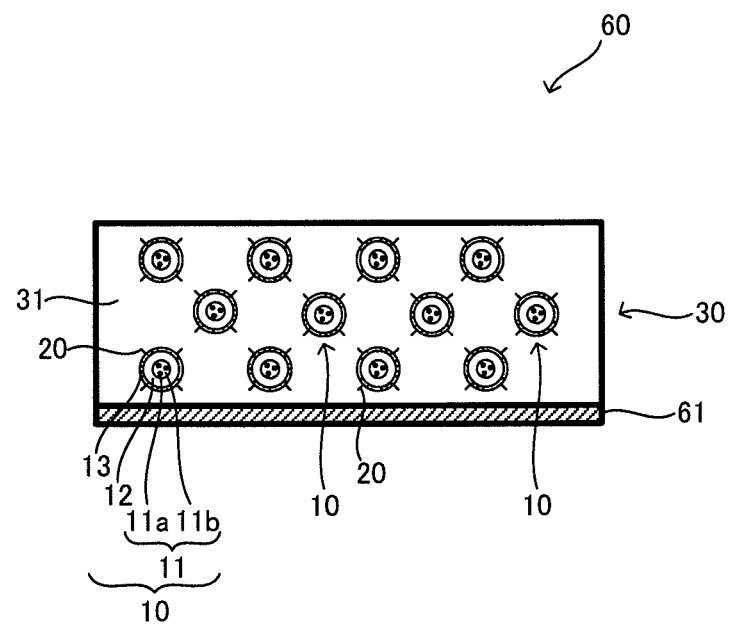
FIG. 6 is a view to explain a composite particle dispersion 60.

FIG. 6 is a view to explain the composite particle dispersion 60 of the present invention. In FIG. 6, to the same structure as those in the composite particle dispersion 30 shown in FIG. 3, the same reference numerals as those used in FIG. 3 are given and the explanation thereof are arbitrarily omitted.

The composite particle dispersion 60 shown in FIG. 6 includes the composite particle dispersion 30 and a metal member 61 which is arranged so as to be in contact with the supporting material 31. According to the composite particle dispersion 60 configured as above, it is possible to increase the intensity of the light to be absorbed by the semiconductor member 12, 12, . . . of the composite particle 10, 10, . . . existing close to the metal member (for example, a distance from the metal member 61 of approximately no more than 100 nm). By increasing the intensity of the light to be absorbed by the semiconductor member 12 as described above, it becomes possible to increase the intensity of the energy to transfer to the core member 11, whereby it becomes possible to increase the upconversion intensity by the activator 11a, 11a, . . . . Therefore, according to the composite particle dispersion 60 including the metal member 61 arranged so as to be in contact with the supporting material 31, it is possible to increase the upconversion intensity in the composite particle 10, 10, . . . existing close to the metal member 61.

In the above explanation regarding the composite particle dispersion of the present invention prepared with the metal member 61, a configuration in which the composite particle dispersion 30 is used together with the metal member 61 is exemplified. However, the composite particle dispersion of the present invention including the metal member arranged so as to be in contact with the supporting material is not limited to this configuration. The composite particle dispersion used together with the metal material may be the above composite particle dispersion 40, may be the above composite particle dispersion 50, or may be a composite particle dispersion having a configuration in which the composite particle of the present invention, a quantum dot configured in the same manner as in the composite particle of the present invention except that it does not include the core member, and the metal fine particle are dispersed in the supporting material. Even if each of the composite particle dispersions having these configurations is used with the metal member, it becomes possible to increase the upconversion intensity in the composite particle existing close to the metal member.

3. Photovoltaic Device

Figure 7:
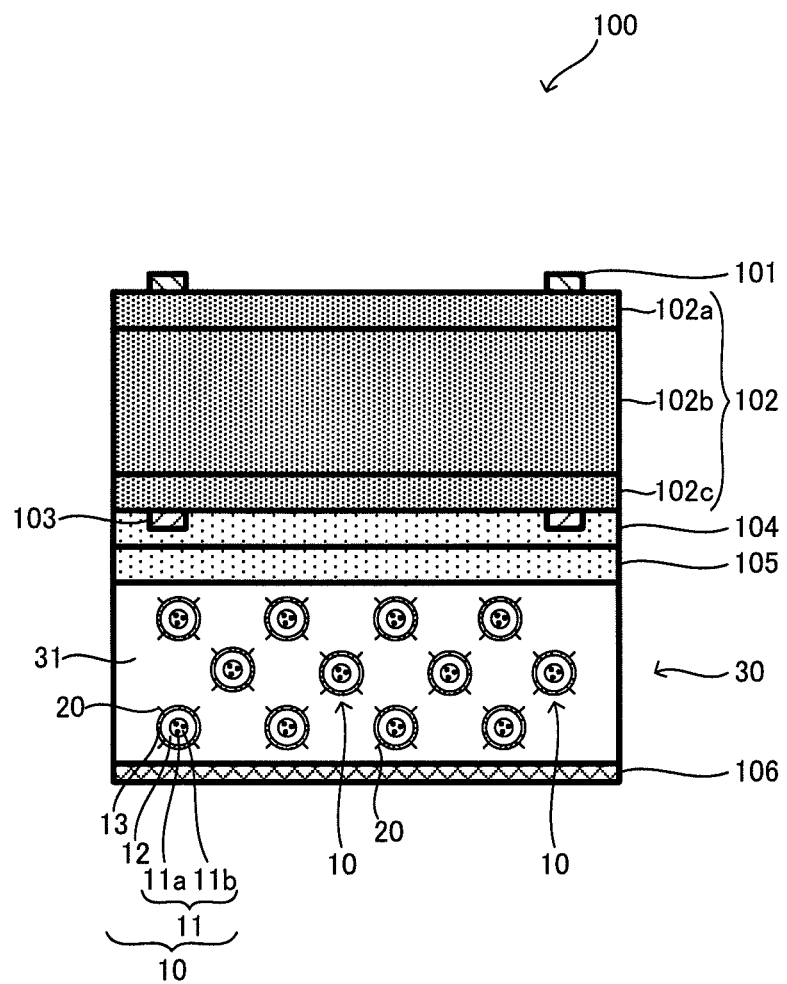
FIG. 7 is a view to explain a voltaic device 100.

FIG. 7 is a view to explain a photovoltaic device 100 of the present invention. In FIG. 7, to the same structure as those in the composite particle dispersion 30 shown in FIG. 3, the same reference numerals as those used in FIG. 3 are given and the explanation thereof is arbitrarily omitted. In FIG. 7, the upper side of the plane of paper is the upstream side of a light propagation direction of the incident light.

The photovoltaic device 100 shown in FIG. 7 includes a first electrode 101, a photovoltaic conversion member 102, a second electrode 103, a transparent resin layer 104, a transparent glass layer 105, the composite particle dispersion 30, and a light reflecting member 106 that are arranged in the order mentioned from the upstream side of the light propagation direction. The first electrode 101 and the second electrode 103 that are in contact with the photovoltaic conversion member 102 are comb-shaped electrodes, for the purpose of enabling light to enter the photovoltaic conversion member 102 and the composite particle dispersion 30, and are configured by a known electroconductive material. The photovoltaic conversion member 102 includes an n layer 102a, an i layer 102b, and a p layer 102c in the order mentioned from the top. The electricity generated by these layers absorbing light is taken outside via the first electrode 101 and the second electrode 103. The transparent resin layer 104 is provided in order to reduce unevenness of the surface on a composite particle dispersion 30 side of the p layer 102c, the unevenness being to be formed by the second electrode 103 arranged. The transparent glass layer 105 arranged on the upper side of the composite particle dispersion 30 is connected to the p layer 102c and the second electrode 103, via the transparent resin layer 104. The transparent glass layer 105 is provided: (1) in order to increase the mechanical strength; (2) as a substrate in manufacturing a battery to be arranged on the upper side; and (3) as a substrate in forming the composite particle dispersion 30. The composite particle dispersion 30 and the light reflecting member 106 which reflects the light progressing from the upper side of the plane of paper to the lower side of the plane of paper, to the upper side of the plane of paper are provided on a lower side of the transparent glass layer 105.

When light enters the photovoltaic device 100, light having energy same as or more than the band gap of the semiconductor material configuring the photovoltaic conversion member 102 is absorbed by the photovoltaic conversion member 102 and converted to electricity. Light having energy smaller than the band gap of the semiconductor material configuring the photovoltaic conversion member 102 is not used for photovoltaic conversion in the photovoltaic conversion member 102; the light passes through the photovoltaic conversion member 102, the transparent resin layer 104, and the transparent glass layer 105, and enters the composite particle dispersion 30. As described above, the upconversion efficiency of the composite particle dispersion 30 is improved and whereby the composite particle dispersion 30 can create light having energy which can be used for the photovoltaic conversion in the photovoltaic conversion member 102, from the incident light having a low energy. The light created in the composite particle dispersion 30 goes in various directions. Among the light created in the composite particle dispersion 30, the light which goes to the upper side of the plane of paper passes through the transparent glass layer 105 and the transparent resin layer 104, and enters the photovoltaic conversion member 102, whereby it is used for the photovoltaic conversion in the photovoltaic conversion member 102. In contrast, the light which goes to the lower side of the plane of paper is reflected toward the upper side of the plane of paper by the light reflecting member 106, then it passes through the composite particle dispersion 30, the transparent glass layer 105, and the transparent resin layer 104, and enters the photovoltaic conversion member 102, whereby it is used for the photovoltaic conversion in the photovoltaic conversion member 102.

According to the photovoltaic conversion device 100 including the composite particle dispersion 30, the light of a band which is not used for the photovoltaic conversion in the photovoltaic conversion member 102 in nature is converted to light of a band which can be used for the photovoltaic conversion in the photovoltaic conversion member 102, by means of the composite particle dispersion 30. The converted light enters the photovoltaic conversion member 102, thereby being converted to electricity. Since the composite particle dispersion 30 can increase the light of the band which can be used for photovoltaic conversion as described above, according to the photovoltaic device 100, it is possible to improve power generation efficiency.

In the photovoltaic device 100, in order for the photovoltaic conversion member 102 to absorb not only the incident light from the upper side of the plane of paper, but also the incident light from the composite particle dispersion 30 side, the photovoltaic conversion member 102 needs to be double-sided light receiving type. The photovoltaic conversion member 102 having such a configuration can be made of a known substance which can absorb the light generated in the composite particle dispersion 30 and convert the light to electricity. For the photovoltaic conversion member 102, for example a known double-sided light receiving type photovoltaic conversion device which can take out electricity generated by irradiating light, such as single crystal Si, amorphous Si, CIGS, organic solar cells, dye sensitized solar cells, compound solar cells can be adequately used. More specifically, a photovoltaic conversion device made by: peeling the substrate from a known configuration such as single crystal Si, HIT solar cell, and compound solar cells; thereafter forming an electrode on the surface where the substrate is peeled off (peeling off type) and the like can be used. A photovoltaic device in which a solar cell is formed by a known method on a transparent glass (formed on a glass) can also be used. When the peeling off type is used, the composite particle dispersion 30 is formed on the transparent glass layer 105, and the cell is attached to the opposite side of the transparent glass layer 105. When the device in which a solar cell is formed on a glass, the composite particle dispersion 30 can be formed on the opposite side of the transparent glass layer 105. In the photovoltaic device 100, in view of making it easy to improve the power generation efficiency and the like, it is preferable that a semiconductor material having a band gap energy of approximately no less than 1.5 eV and no more than 2.4 eV is used for the photovoltaic conversion member 102. The photovoltaic conversion member 102 configured as above can be produced by a known method.

Also, for the transparent resin layer 104, a known transparent resin which can be used for a solar cell and can bond the p layer 102c and the second electrode 103 to the transparent layer 105 can be adequately used. Examples of such a transparent resin include polyvinyl alcohol (PVA), polystyrene, acrylic resin and the like.

Also, for the transparent glass layer 105, a known transparent glass which can be used for a solar cell can be adequately used.

For the light reflecting member 106, a known reflecting material which can reflect the light which comes from the composite particle dispersion 30 side, to the composite particle dispersion 30 side can be adequately used. The light reflecting member 106 can be configured by a known material and its shape is not particularly limited.

Figure 8:
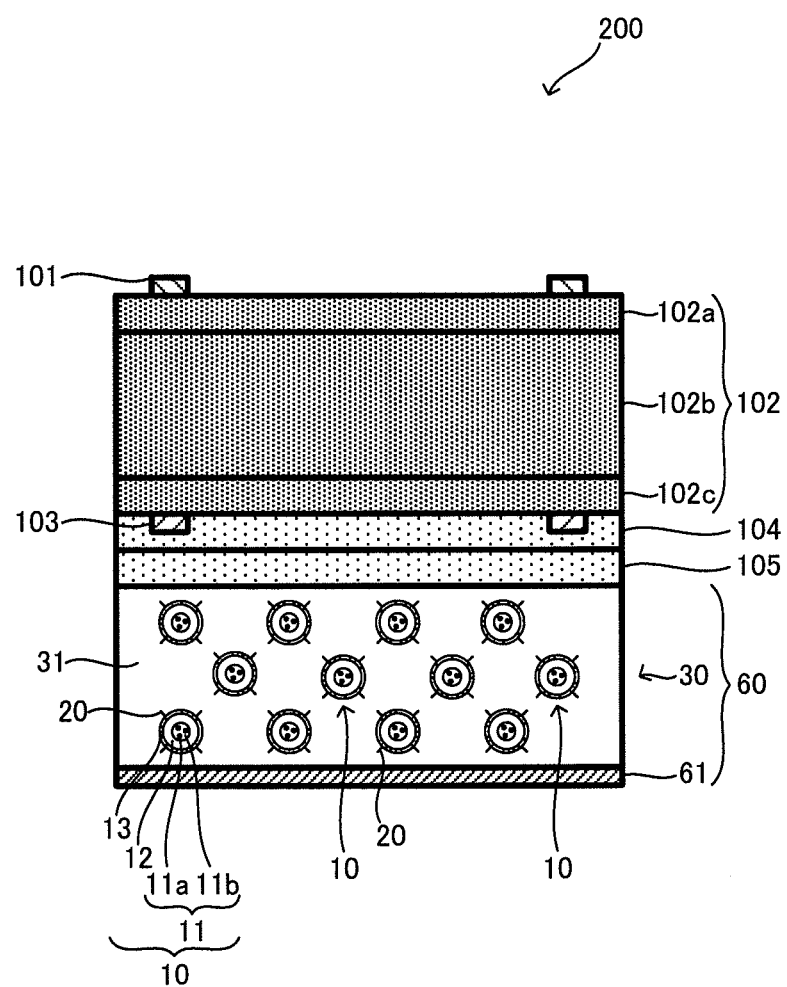
FIG. 8 is a view to explain a voltaic device 200.

FIG. 8 is a view to explain a photovoltaic conversion device 200 of the present invention. In FIG. 8, to the same structure as those in the photovoltaic conversion device 100 shown in FIG. 7, the same reference numerals as those used in FIG. 7 are given and the explanation thereof is arbitrarily omitted. In FIG. 8, the upper side of the plane of paper is the upstream side of the light propagation direction of the incident light.

The photovoltaic conversion device 200 shown in FIG. 8 is configured in the same manner as the photovoltaic conversion device 100 except that the composite particle dispersion 60 is used instead of the composite particle dispersion 30 and the light reflecting member 106. The metal material 61 of the composite particle dispersion 60 has a function of reflecting the light going from the upper side to the lower side of the plane of paper, to the upper side of the plane of paper. Therefore, among the light generated in the composite particle dispersion 60, the light going to the lower side of the plane of paper can enter the photovoltaic conversion member 102 by being reflected by the metal material 61, thereby being converted to electricity in the photovoltaic conversion member 102.

Since the composite particle dispersion 60 includes the metal member 61 as described above, it is possible to increase the upconversion intensity in the composite particle 10, 10, . . . by the effect of the surface plasmon resonance. That is, according to the photovoltaic device 200, it is possible to generate the light whose intensity is increased from the composite particle dispersion 60, whereby it is possible to make the light enter the photovoltaic conversion member 102. By increasing the intensity of the incident light, it becomes possible to improve the conversion efficiency. Therefore, according to the photovoltaic device 200, it is possible to improve the conversion efficiency.

DESCRIPTION OF THE REFERENCE NUMERALS 10 composite particle
11 core member
11a activator (rare earth ion which shows upconversion effect)
11b retaining material
12 semiconductor member
13 shell member
20 ligand
30, 40, 50, 60 composite particle dispersion (wavelength conversion member)
31 supporting material
41 quantum dot
51 metal fine particle
61 metal material
100, 200 photovoltaic conversion device
101 first electrode
102 photovoltaic conversion member
102a n layer
102b i layer
102c p layer
103 second electrode
104 transparent resin layer
105 transparent glass layer
106 light reflecting member

The invention claimed is:
1. A composite particle comprising:
a core member comprising: a rare earth ion which shows an upconversion effect; and a retaining material which retains the rare earth ion; and
a semiconductor member covering a part or all of the surface of the core member,
wherein the retaining material comprises a semiconductor material having a band gap greater than energy difference necessary for a second step excitation in the rare earth ion to occur, or an insulating material; and
the semiconductor member comprises a semiconductor material having a band gap smaller than energy difference between a first excited state and a ground state of the rare earth ion.
2. The composite particle according to claim 1,
wherein a part or all of the surface of the semiconductor member is covered by a semiconductor material having a band gap greater than the band gap of the semiconductor material comprised in the semiconductor member, or by an insulating material.
3. The composite particle according to claim 1, wherein

$X/Y \leq 1/100$ wherein X is amount of the rare earth ion comprised in the core member by mole, and Y is amount of the semiconductor material comprised in the semiconductor member by mole.

4. The composite particle according to claim 1,
wherein the core member comprises Er ion as the rare earth ion.

5. The composite particle according to claim 4,
wherein the core member and/or the semiconductor member comprises Yb ion.

6. A composite particle dispersion comprising:
a supporting material; and
the composite particle according to claim 1,
wherein the surface of the composite particle is modified by a ligand; and
the composite particle is dispersed in the supporting material and is supported by the supporting material.

7. The composite particle dispersion according to claim 6, further comprising:
a quantum dot dispersed in the supporting material,
wherein the quantum dot does not comprise the rare earth ion which shows upconversion effect.

8. The composite particle dispersion according to claim 6, further comprising:
a metal fine particle dispersed in the supporting material.

9. The composite particle dispersion according to claim 6, further comprising:
a metal member in contact with the surface of the supporting material.

10. A photovoltaic device comprising:
a photoelectric conversion member which converts light energy to electricity;
a wavelength conversion member comprising the composite particle dispersion according to claim 6; and
a light reflecting member,
wherein the photoelectric conversion member, the wavelength conversion member, and the light reflecting member are arranged in the order mentioned from the upstream side of a light propagation direction.

11. A photovoltaic device comprising:
a photoelectric conversion member which converts light energy to electricity; and
a wavelength conversion member comprising the composite particle dispersion according to claim 9,
wherein the photoelectric conversion member and the wavelength conversion member are arranged in the order mentioned from the upstream side of a light propagation direction; and
the supporting material is arranged between the metal member and the photoelectric conversion member.

* * * * *